(12) United States Patent
Yoon

(10) Patent No.: US 8,052,497 B2
(45) Date of Patent: Nov. 8, 2011

(54) ORGANIC LIGHT EMITTING DEVICE, METHOD OF MANUFACTURING THE SAME, AND METHOD OF FORMING ORGANIC LAYER

(75) Inventor: Ji-Hwan Yoon, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 69 days.

(21) Appl. No.: 12/422,186

(22) Filed: Apr. 10, 2009

(65) Prior Publication Data

US 2009/0197496 A1 Aug. 6, 2009

Related U.S. Application Data

(62) Division of application No. 11/967,594, filed on Dec. 31, 2007, now Pat. No. 7,535,167.

(30) Foreign Application Priority Data

Feb. 20, 2007 (KR) .................. 10-2007-0017086

(51) Int. Cl.
*H01J 9/20* (2006.01)
*H01J 9/22* (2006.01)

(52) U.S. Cl. .............. 445/24; 445/23; 445/25; 313/498; 313/504; 313/506

(58) Field of Classification Search .............. 445/23–25; 313/498–512
See application file for complete search history.

(56) References Cited

U.S. PATENT DOCUMENTS

| 4,356,429 | A | 10/1982 | Tang |
| 6,541,130 | B2 | 4/2003 | Fukuda |
| 6,750,608 | B2 | 6/2004 | Matsuura et al. |
| 2003/0099860 | A1 | 5/2003 | Lin et al. |
| 2006/0088729 | A1* | 4/2006 | Begley et al. ................. 428/690 |
| 2006/0170339 | A1* | 8/2006 | Kanno et al. ................. 313/506 |
| 2006/0181202 | A1 | 8/2006 | Liao et al. |
| 2007/0048545 | A1 | 3/2007 | Hatwar et al. |

FOREIGN PATENT DOCUMENTS

| CN | 1391424 A | 1/2003 |
| CN | 1839493 A | 9/2006 |
| JP | 10-316658 | 12/1998 |
| JP | 2000-063335 | 2/2000 |
| JP | 2002367787 A | * 12/2002 |
| KR | 10-2002-0026866 A | 4/2002 |
| KR | 10-2005-0040960 | 5/2005 |

OTHER PUBLICATIONS

Patent Abstracts of Japan, Publication No. 10-316658, dated Dec. 2, 1998 in the name of Ichinosawa et al.
Patent Abstracts of Japan, Publication No. 2000-063335, dated Feb. 29, 2000 in the name of Ueda et al.
Korean Patent Abstracts, Publication No. 1020020026866, dated Apr. 12, 2002 in the name of Chishio Hosokawa.

(Continued)

*Primary Examiner* — Joseph L Williams
*Assistant Examiner* — Nathaniel Lee
(74) *Attorney, Agent, or Firm* — Christie, Parker & Hale, LLP

(57) ABSTRACT

An organic light emitting device that has improved lifespan properties by improving the characteristics of an interface between at least one of a red emissive layer, a green emissive layer or a blue emissive layer, and an electron transport layer, and a method of manufacturing the organic light emitting device.

18 Claims, 6 Drawing Sheets

OTHER PUBLICATIONS

Korean Patent Abstracts, Publication No. 1020050040960 A; Date of Publication: May 4, 2005; in the name of Dong Hyun Jung et al.
SIPO Office action dated Jun. 12, 2010, for corresponding Chinese Patent application 200810081061.X, noting listed reference in this IDS.

SIPO Certificate of Patent dated Jul. 27, 2011, for corresponding Chinese Patent application 200810081061.X, noting listed references in this IDS, as well as CN 1391424, previously submitted in an IDS dated Jul. 1, 2010, 20 pages.

* cited by examiner

ORGANIC LIGHT EMITTING DEVICE, METHOD OF MANUFACTURING THE SAME, AND METHOD OF FORMING ORGANIC LAYER

CROSS-REFERENCE TO RELATED PATENT APPLICATION

This is a divisional application of U.S. patent application Ser. No. 11/967,594 filed Dec. 31 2007 now U.S. Pat. No. 7,535,167 which claims priority to and the benefit of Korean Patent Application No. 10-2007-0017086, filed on Feb. 20, 2007, in the Korean Intellectual Property Office, the entire content of which is incorporated herein by reference.

BACKGROUND OF THE INVENTION

1. Field of the Invention

The present invention relates to an organic light emitting device, a method of manufacturing the same, and a method of forming an organic layer.

2. Description of the Related Art

An organic light emitting device is a self-emitting device that has a wide viewing angle, excellent contrast, and quick response time. Also, a lot of research has been conducted on organic light emitting devices because of their lower driving voltages and quicker response times, and because they can realize multicolor images.

A conventional organic light emitting device has a stacked structure in the form of an anode/emissive layer/cathode structure. A hole injection layer, a hole transport layer, and an electron injection layer may be additionally formed between the anode and the emissive layer or between the emissive layer and the cathode to form an anode/hole transport layer/emissive layer/cathode structure, an anode/hole transport layer/emissive layer/electron injection layer/cathode structure, or the like. Korean Patent Publication No. 10-2005-0040960, the entire content of which is incorporated herein by reference, discloses such an organic light emitting device.

However, a conventional organic light emitting device does not have satisfactory lifespan properties, and thus there is a need for further improvement.

SUMMARY OF THE INVENTION

Aspects of embodiments of the present invention are directed toward an organic light emitting device that has long lifespan by improving the characteristics of an interface between an emissive layer (e.g., at least one of a red emissive layer, a green emissive layer, or a blue emissive layer) and an electron transport layer, a method of manufacturing the organic light emitting device, and a method of forming an organic layer having a multilayer structure.

An embodiment of the present invention provides an organic light emitting device that includes: a substrate; a first electrode on the substrate; a second electrode facing the first electrode; and an organic layer between the first electrode and the second electrode, and including an emissive layer and an electron transport layer. Here, the emissive layer includes: a red emissive layer, a green emissive layer, and a blue emissive layer. The electron transport layer includes: a first electron transport layer including at least one of a first layer on the red emissive layer and having substantially the same pattern as that of the red emissive layer, a second layer on the green emissive layer and having substantially the same pattern as that of the green emissive layer, or a third layer on the blue emissive layer and having substantially the same pattern as that of the blue emissive layer; and a second electron transport layer on the first electron transport layer as a common layer with respect to red, green, and blue sub-pixels.

In one embodiment, the first electron transport layer includes the first layer, the second layer, and the third layer.

In one embodiment, the first layer is on the red emissive layer, and the second electron transport layer is on the first layer; the second layer is on the green emissive layer, and the second electron transport layer is on the second layer; and the third layer is on the blue emissive layer, and the second electron transport layer is on the third layer.

In one embodiment, the thicknesses of the first layer, the second layer, and the third layer are substantially identical to one another.

In one embodiment, a thickness ratio of the first layer to the second electron transport layer, a thickness ratio of the second layer to the second electron transport layer, and a thickness ratio of the third layer to the second electron transport layer are in the range from about 1:9 to about 4:6.

In one embodiment, the organic layer further includes at least one of a hole injection layer, a hole transport layer, a hole blocking layer, or an electron injection layer.

Another embodiment of the present invention provides a method of manufacturing an organic light emitting device that includes: forming a first electrode on a substrate; forming on the first electrode an organic layer including an emissive layer and an electron transport layer; and forming a second electrode on the organic layer, wherein the emissive layer includes: a red emissive layer, a green emissive layer, and a blue emissive layer, wherein the electron transport layers includes: a first electron transport layer including at least one of a first layer on the red emissive layer and having substantially the same pattern as that of the red emissive layer, a second layer on the green emissive layer and having substantially the same pattern as that of the green emissive layer, and a third layer on the blue emissive layer and having substantially the same pattern as that of the blue emissive layer; and a second electron transport layer on the first electron transport layer as a common layer with respect to red, green, and blue sub-pixels, and wherein the forming the organic layer includes: a) forming the emissive layer and the first electron transport layer, the forming the emissive layer and the first electron transport layer including at least one of forming the red emissive layer and then forming the first layer in a first deposition chamber for forming the red emissive layer; forming the green emissive layer and then forming the second layer in a second deposition chamber for forming the green emissive layer; or forming the blue emissive layer and then forming the third layer in a third deposition chamber for forming the blue emissive layer, and b) forming the second electron transport layer on the first electron transport layer as a common layer with respect to the red, green, and blue sub-pixels.

In one embodiment, the first layer is formed utilizing a mask for forming the red emissive layer.

In one embodiment, the second layer is formed utilizing a mask for forming the green emissive layer.

In one embodiment, the third layer is formed utilizing a mask for forming the blue emissive layer.

In one embodiment, the first layer and the second electron transport layer are sequentially formed on the red emissive layer, the second layer and the second electron transport layer are sequentially formed on the green emissive layer, and the third layer and the second electron transport layer are sequentially formed on the blue emissive layer.

Another embodiment of the present invention provides a method of forming an organic layer that includes: forming a first organic layer formed of a first organic material in a first chamber; forming on the first organic layer in the first chamber a second organic layer formed of a second organic material; and forming on the second organic layer in a second chamber a third organic layer formed of the second organic material.

In the forming of the organic layers, the first, second, and third organic layers are disposed between a pair of electrodes of an organic light emitting device.

The organic light emitting device according to an embodiment as described above has improved lifespan properties.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
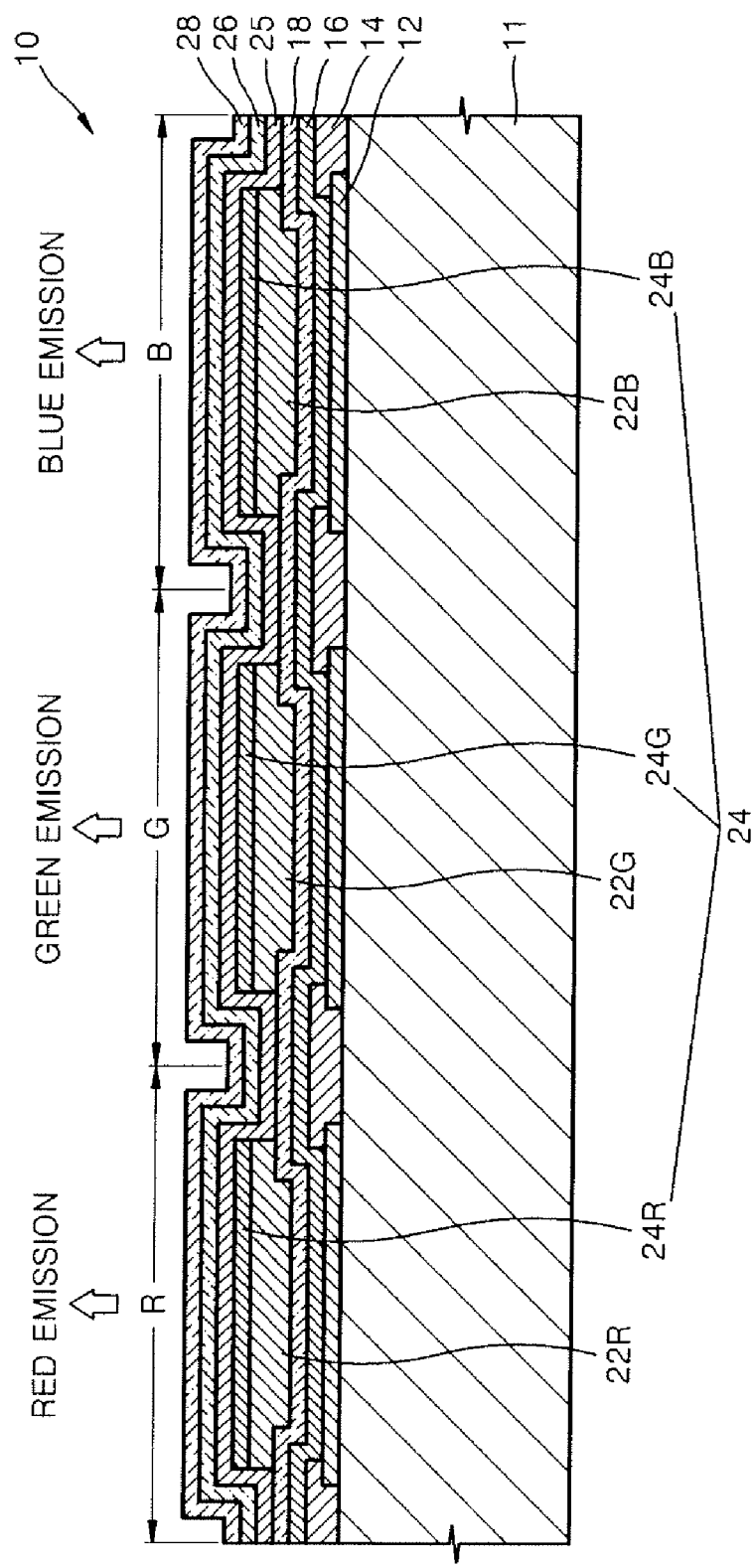
FIG. 1 is a schematic cross-sectional view of an organic light emitting device according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIG. 1 is a schematic cross-sectional view of an organic light emitting device 10 according to an embodiment of the present invention.

Referring to FIG. 1, the organic light emitting device 10 includes a substrate 11, first electrodes 12, a hole injection layer 16 and a hole transport layer 18. In addition, a red emissive layer 22R, a green emissive layer 22G, and a blue emissive layer 22B are patterned on the hole transport layer 18. A first electron transport layer 24 and a second electron transport layer 25 are sequentially formed on the emissive layers 22R, 22G, and 22B. The first electron transport layer 24 includes: a first layer 24R that is formed on the red emissive layer 22R and has the same (or substantially the same) pattern as that of the red emissive layer 22R; a second layer 24G that is formed on the green emissive layer 22G and has the same (or substantially the same) pattern as that of the green emissive layer 22G; and a third layer 24B that is formed on the blue emissive layer 22B and has the same (or substantially the same) pattern as that of the blue emissive layer 22B. The second electron transport layer 25 is formed as a common layer with respect to red, green, and blue sub-pixels (R, G and B). An electron injection layer 26 and a second electrode 28 are formed on the second electron transport layer 25.

In FIG. 1, the substrate 11 can be any suitable substrate used in conventional organic light-emitting devices such as a glass substrate or a transparent plastic substrate, which has superior mechanical strength, thermostability, transparency, surface smoothness, ease of treatment, and waterproof properties. Although not shown in FIG. 1, a planarization layer, an insulating layer, and the like can be further formed on the substrate 11.

The first electrodes 12 are formed on the substrate 11. The first electrodes 12 can be patterned according to red, green and blue sub-pixels (R, G, B) as described in FIG. 1, and may each be an anode or a cathode. The first electrodes 12 can be transparent, semitransparent, or reflexive, and formed of ITO, IZO, $SnO_2$, ZnO, Al, Ag, Mg or the like, but the present invention is not limited thereto. In addition, various suitable modifications are possible such that a structure having at least two layers can be obtained using at least two different materials.

Insulating layers 14 are formed on both ends (or end portions) of the first electrodes 12 and the substrate 11. The insulating layers 14 can be formed of a suitable insulating material that may be an inorganic material, such as $SiO_2$, $SiN_x$ or the like, and/or an organic material, such as a polyimide-based resin, an acryl-based resin or the like.

The hole injection layer 16 is formed on the first electrodes 12. The hole injection layer 16 can be formed as a common layer with respect to red, green and blue sup pixels (R, G, B) as illustrated in FIG. 1. In addition, although not illustrated in FIG. 1, various suitable modifications are possible such that the hole injection layer 16 can be patterned according to the red, green, and blue sub-pixels (R, G, B).

The hole injection layer 16 can be formed using various suitable methods such as vacuum deposition, spin coating, casting, Langmuir Blodgett (LB), or the like.

When vacuum deposition is used to form the hole injection layer 16, the deposition conditions may vary according to the compound used and the structure and thermal properties of the hole injection layer 16 to be formed. In general, however, the conditions for vacuum deposition may be in a temperature ranging from 100 to 500° C., a pressure ranging from $10^{-8}$ to $10^{-3}$ torr, a deposition speed ranging from 0.01 to 100 Å/sec, and a layer thickness ranging from 10 Å to 5 μm.

When spin coating is used to form the hole injection layer 16, the coating conditions may vary according to the compound used, and the structure and thermal properties of the hole injection layer 16 to be formed. In general, however, the conditions for spin coating may be in a coating speed ranging from about 2000 to about 5000 rpm, and a heat treatment temperature ranging from about 80 to about 200° C. to remove the solvent after coating.

More particularly, the hole injection layer 16 may be formed of any suitable hole injection materials. Examples of the hole injection materials include phthalocyanine compounds such as copperphthalocyanine, which is disclosed in U.S. Pat. No. 4,356,429 and the entire content of which is incorporated herein by reference, star-burst type amine derivatives such as TCTA, m-MTDATA, and m-MTDAPB, which are disclosed in Advanced Material, 6, p. 677 (1994) and the entire content of which is incorporated herein by reference, or soluble conductive polymers such as Pani/DBSA (Polyaniline/Dodecylbenzenesulfonic acid) or PEDOT/PSS (Poly (3,4-ethylenedioxythiophene)/Poly (4-styrenesulfonate), Pani/CSA (Polyaniline/Camphor sulfonicacid) or PANI/PSS (Polyaniline)/Poly (4-styrenesulfonate)), but are not limited thereto.

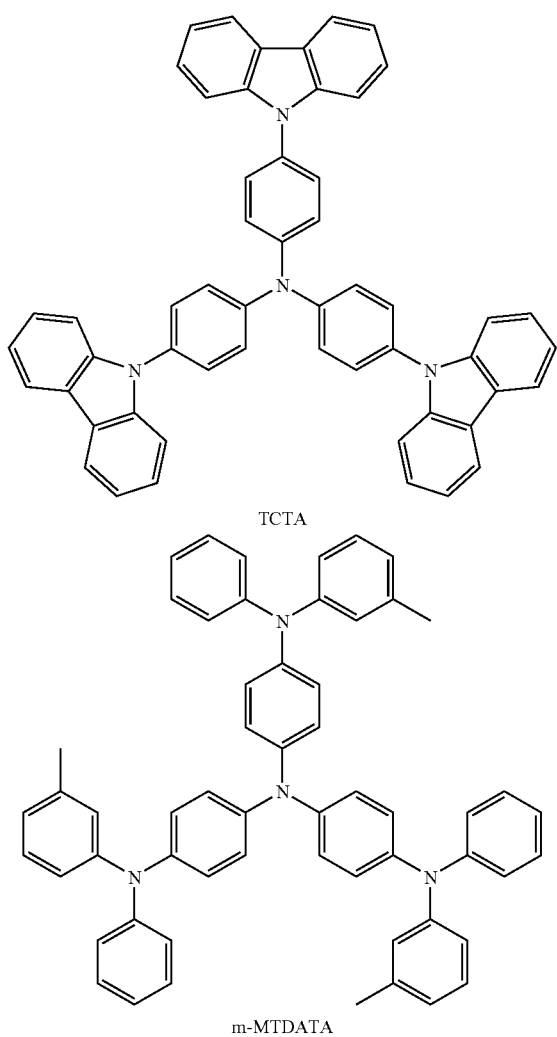

TCTA m-MTDATA

The thickness of the hole transport layer 18 may be between 10-200 nm, and, in one embodiment, be between 20-150 nm. The thickness of the hole transport layer 18 may be selected within these ranges taking into consideration the driving voltage properties, manufacturing time, and manufacturing cost.

The hole transport layer 18 is formed on the hole injection layer 16. The hole transport layer 18 can be formed using various suitable methods such as vacuum deposition, spin coating, casting, Langmuir Blodgett (LB), or the like. When vacuum deposition or spin coating is used to form the hole transport layer 18, the deposition or coating conditions may vary according to the compound used. In general, however, the deposition or coating conditions used to form the hole injection layer 16 are the same (or substantially the same) as those for forming the hole transport layer 18.

The hole transport layer 18 can be formed as a common layer with respect to red, green and blue sup pixels (R, G, B) as illustrated in FIG. 1. In addition, although not illustrated in FIG. 1, various suitable modifications are possible such that the hole transport layer 18 can be patterned according to the red, green and blue sub-pixels (R, G, B).

More particularly, the hole transport layer 18 may be formed of any suitable hole transport materials. Examples of the hole transport materials include a carbazole derivative, such as N-phenylcarbazole or polyvinylcarbazole; an amine derivative having an aromatic fused ring such as N,N'-bis(3-methylphenyl-N,N'-diphenyl-[1,1-biphenyl]-4,4'-diamine (TPD) or N,N'-di(naphthalene-1-yl)-N,N'-diphenylbenzidine (α-NPD); or the like.

Each of the red emissive layer 22R, the green emissive layer 22G, and the blue emissive layer 22B is patterned on the hole transport layer 18 according to the red, green and blue sub-pixels (R, G, B), respectively.

The red emissive layer 22R, the green emissive layer 22G, and the blue emissive layer 22B can be formed of various suitable emitting materials, or suitable host and dopant materials. The dopant materials can be any suitable fluorescent dopants and/or phosphorescent dopants.

Examples of the host materials include $Alq_3$, CBP(4,4'-N,N'-dicarbazole-biphenyl), PVK(poly(n-vinylcarbazole)), distyrylarylene (DSA) and the like, but are not limited thereto.

Examples of the dopant materials include PtOEP, $Ir(piq)_3$, $Btp_2Ir(acac)$, DCJTB and the like as a red dopant, but are not limited thereto.

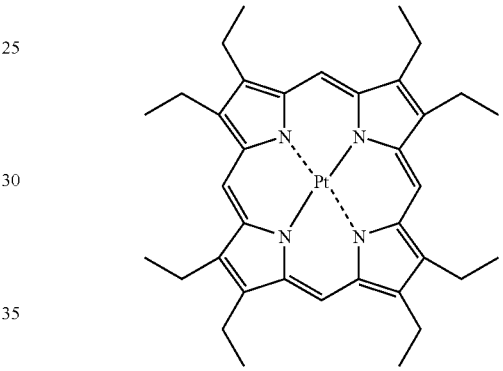

PtOEP

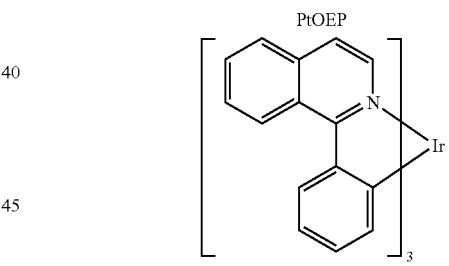

$Ir(piq)_3$

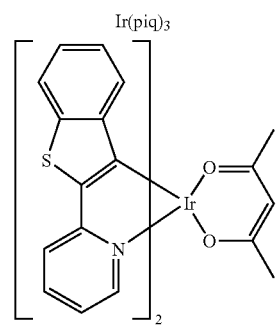

$Btp_2Ir(acac)$

In addition, examples of the dopant materials include $Ir(ppy)_3$ (ppy=phenylpyridine), $Ir(ppy)_2(acac)$, $Ir(mpyp)_3$, C545T and the like as a green dopant, but are not limited thereto.

Also, examples of the dopant materials include F$_2$Irpic, (F$_2$ppy)$_2$Ir(tmd), Ir(dfppz)$_3$, ter-fluorene and the like as a blue dopant, but are not limited thereto.

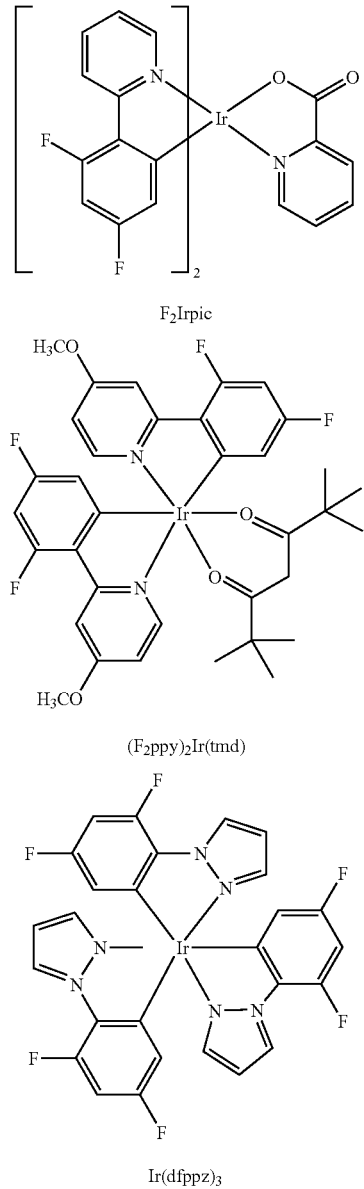

F$_2$Irpic (F$_2$ppy)$_2$Ir(tmd)

Ir(dfppz)$_3$

The amount of the dopant may range from 0.1 to 20 parts by weight based on 100 parts by weight of the total weight of the host and the dopant, and, in one embodiment, may range from 0.5 to 15 parts by weight. When the amount of the dopant is within these ranges, a concentration quenching phenomenon can be substantially limited.

The thickness of the red emissive layer 22R, the green emissive layer 22G and the blue emissive layer 22B may be in the range from about 5 to about 100 nm, and, in one embodiment, may be in the range from 10 to 50 nm. When the thickness of the red emissive layer 22R, the green emissive layer 22G and the blue emissive layer 22B is within the ranges described above, excellent emitting properties can be obtained.

The first electron transport layer 24 and the second electron transport layer 25 are formed on the red emissive layer 22R, the green emissive layer 22G, and the blue emissive layer 22B.

The first electron transport layer 24 includes: a first layer 24R that is formed on the red emissive layer 22R and has the same (or substantially the same) pattern as that of the red emissive layer 22R; a second layer 24G that is formed on the green emissive layer 22G and has the same (or substantially the same) pattern as that of the green emissive layer 22G; and a third layer 24B that is formed on the blue emissive layer 22B and has the same (or substantially the same) pattern as that of the blue emissive layer 22B.

In addition, the second electron transport layer 25 is formed on the first electron transport layer 24 including the first layer 24R, the second layer 24G and the third layer 24B. The second electron transport layer 25 is formed as a common layer with respect to red, green and blue sub-pixels (R, G and B) as illustrated in FIG. 1.

Therefore, in the organic light emitting device 10, the first layer 24R and the second electron transport layer 25 are sequentially formed on the red emissive layer 22R in the red sub-pixel R, the second layer 24G and the second electron transport layer 25 are sequentially formed on the green emissive layer 22G in the green sub-pixel G, and the third layer 24B and the second electron transport layer 25 are sequentially formed on the blue emissive layer 22B in the blue sub-pixel B.

The first electron transport layer 24, including the first layer 24R, the second layer 24G and the third layer 24B, and the second electron transport layer 25, can be composed of any suitable electron transport material. The first electron transport layer 24 and the second electron transport layer 25 can be formed using vacuum deposition. The deposition conditions may vary according to the compound used. In general, however, the deposition conditions used to form the hole injection layer 16 are used to form the first electron transport layer 24 and the second electron transport layer 25. The material for forming the first electron transport layer 24 and the second electron transport layer 25 stably transports electrons injected from a cathode. Examples of the material for forming the first electron transport layer include suitable materials such as quinoline derivatives, and, in one embodiment, the material for forming the first electron transport layer includes tris(8-quinolinorate)aluminium (Alq$_3$), TAZ, Balq or the like, but is not limited thereto.

The thicknesses of the first layer 24R, the second layer 24G and the third layer 24B can be equal to one another or different from one another.

Also, a thickness ratio of the first layer 24R to the second electron transport layer 25, a thickness ratio of the second layer 24G to the second electron transport layer 25, and a thickness ratio of the third layer 24B to the second electron transport layer 25 may be in the range from about 1:9 to about 4:6 (or from 1:9 to 4:6), and, in one embodiment, may be in the range from about 2:8 to about 3:7 (or from 2:8 to 3:7). That is, the thickness of the first layer 24R, the thickness of the second layer 24G or the thickness of the third layer 24B may be in the range from about 10 to about 40% (or from 10 to 40%) with respect to the total thickness of all the electron transport layers. In one embodiment, the thickness of the first layer 24R, the thickness of the second layer 24G or the thickness of the third layer 24B may be in the range from about 20 to about 30% (or from 20 to 30%) with respect to the total thickness of all the electron transport layers. When the thickness ratio of the first, second, and third layers 24R, 24G, and 24B to the second electron transport layer 25 is within these ranges, an organic light emitting device 10 with improved lifespan can be obtained.

More particularly, a method of forming the red emissive layer 22R, the green emissive layer 22G, the blue emissive layer 22B, the first electron transport layer 24, and the second electron transport layer 25 will now be described in more detail with reference to FIGS. 2A through 2G.

Figure 2A:
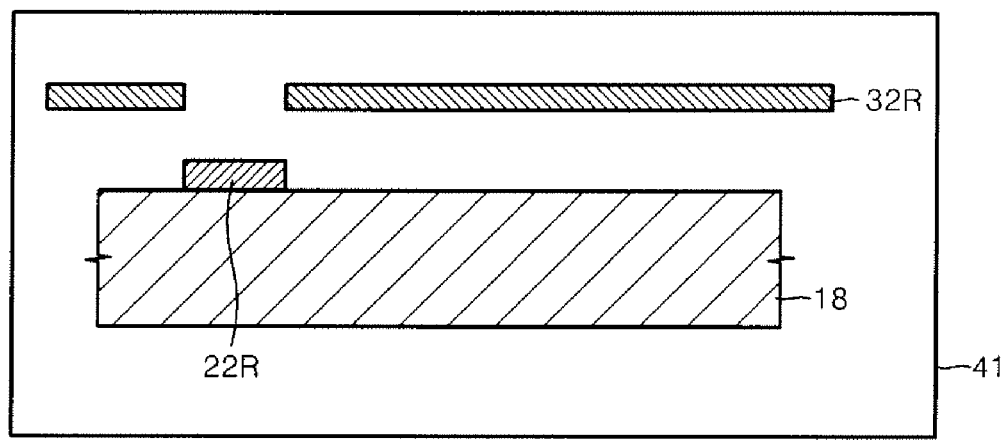
FIGS. 2A, B, C, D, E, F, and G are diagrams illustrating a process of forming an emissive layer and an electron transport layer of an organic light emitting device according to an embodiment of the present invention.

Referring to FIG. 2A, first, in a chamber 41 for forming a red emissive layer, a red emitting material is deposited on the hole transport layer 18 using a mask 32R in order to form the red emissive layer 22R.

Figure 2B:
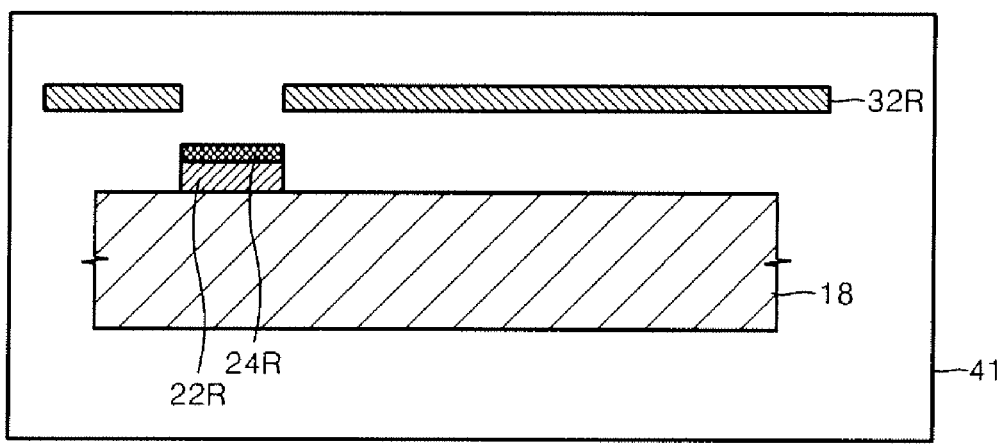

Referring to FIG. 2B, in the chamber 41 for forming the red emissive layer 22R, an electron transporting material is then deposited on the red emissive layer 22R using the mask 32R in order to form the first layer 24R. Thus, the first layer 24R is formed on the red emissive layer 22R and has the same (or substantially the same) pattern as that of the red emissive layer 22R.

Figure 2C:
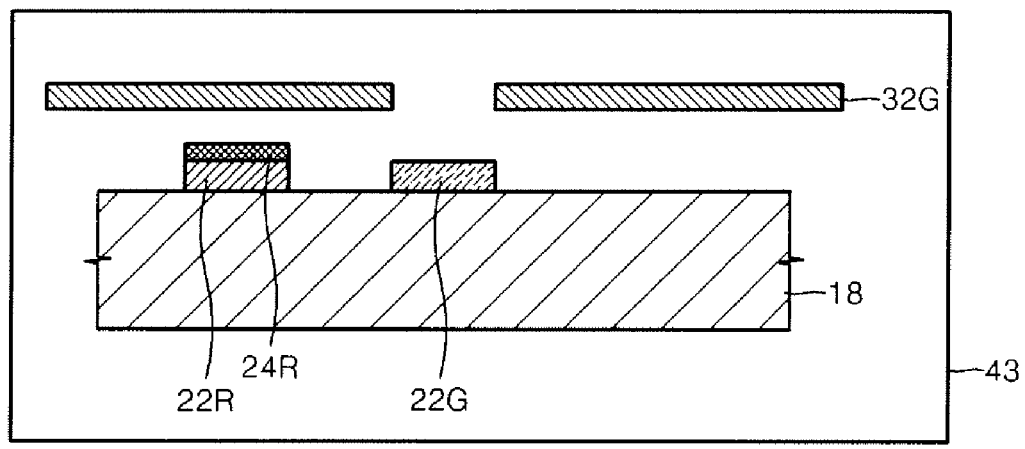

Then, referring to FIG. 2C, in a chamber 43 for forming a green emissive layer, a green emitting material is deposited on the hole transport layer 18 using a mask 32G for forming a green emissive layer 22G.

Figure 2D:
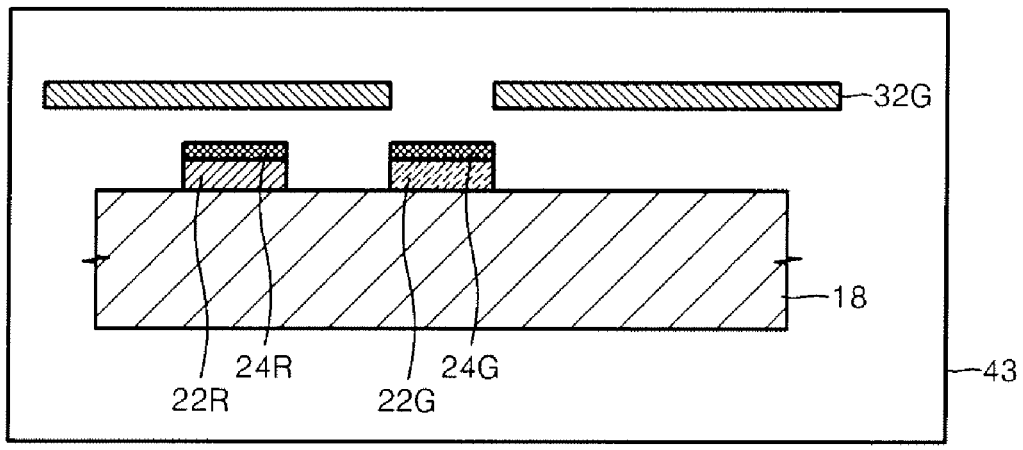

Thereafter, referring to FIG. 2D, in the chamber 43 for forming a green emissive layer 22G, an electron transporting material is deposited on the green emissive layer 22G using the mask 32G in order to form the second layer 24G. Thus, the second layer 24G is formed on the green emissive layer 22G and has the same (or substantially the same) pattern as that of the green emissive layer 22G.

Figure 2E:
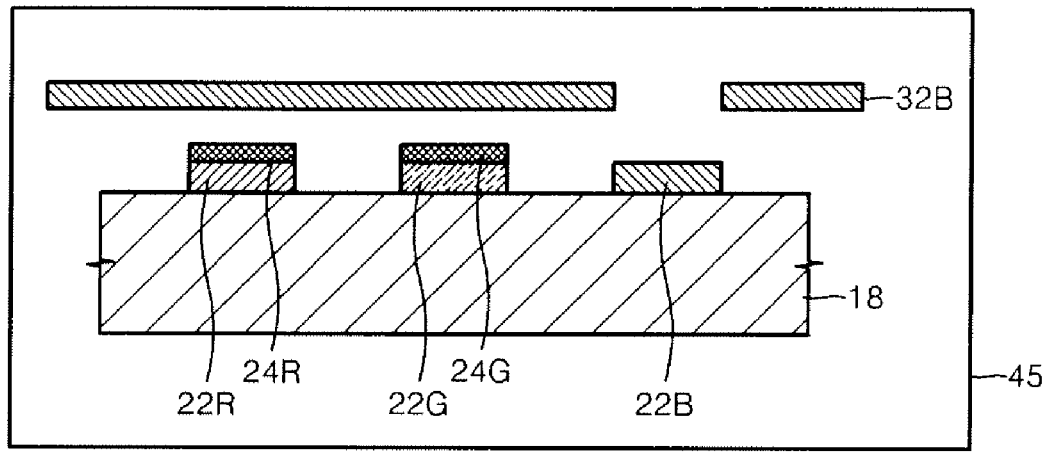

Next, referring to FIG. 2E, in a chamber 45 for forming a blue emissive layer, a blue emitting material is deposited on the hole transport layer 18 using a mask 32B in order to form the blue emissive layer 22B.

Figure 2F:
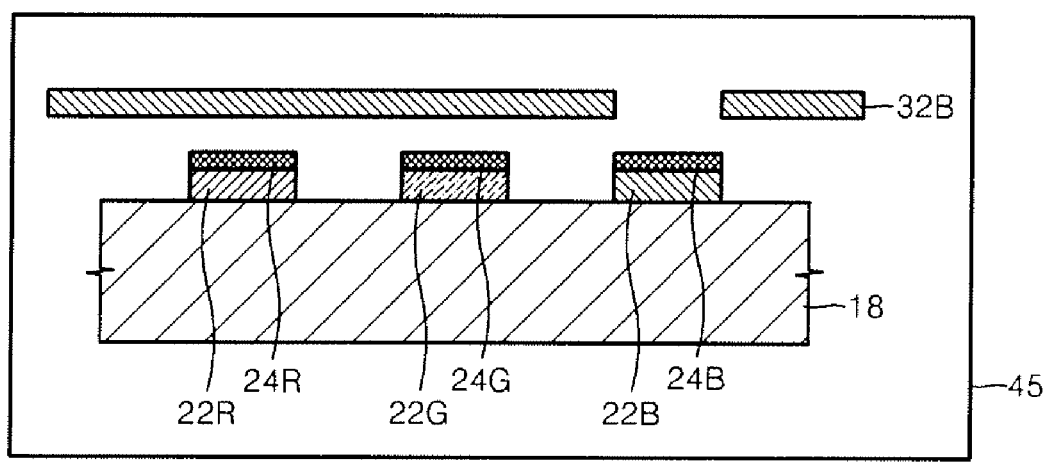

Referring to FIG. 2F, in the chamber 45 for forming a blue emissive layer 22B, an electron transporting material is then deposited on the blue emissive layer 22B using the mask 32B in order to form the third layer 24B. Thus, the third layer 24B is formed on the blue emissive layer 22B and has the same (or substantially the same) pattern as that of the blue emissive layer 22B.

Figure 2G:
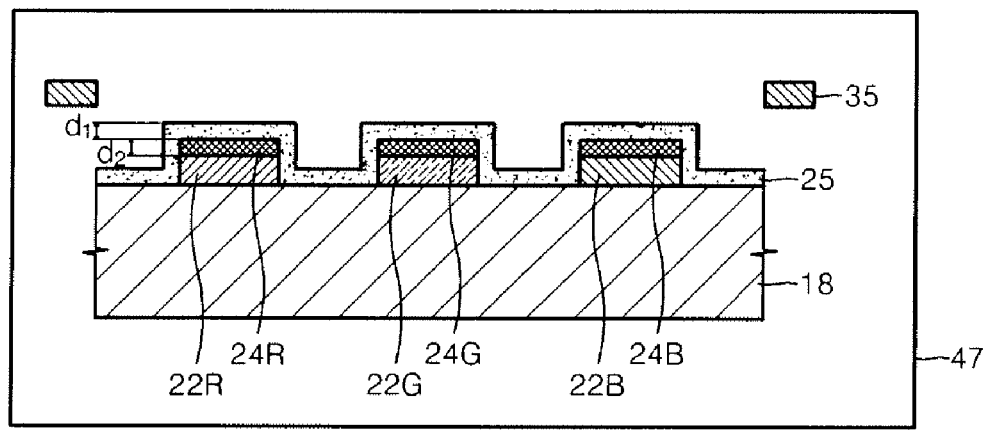

Referring to FIG. 2G, in a chamber 47 for forming an electron transport layer, an electron transporting material is deposited using an open mask 35 to form the second electron transport layer 25, which is a common layer with respect to red, green and blue sub-pixels.

In the organic light emitting device illustrated in FIG. 1, after the red emissive layer 22R, the green emissive layer 22G, and the blue emissive layer 22B are formed, the electron transporting materials are then (or immediately) deposited on the emissive layers 22R, 22G, and 22B in the same chamber in order to form the first layer 24R, the second layer 24G, and the third layer 24B. Therefore, impurities such as moisture or the like do not substantially infiltrate into an interface between the red emissive layer 22R and the first layer 24R, an interface between the green emissive layer 22G and the second layer 24G, and an interface between the blue emissive layer 22B and the third layer 24B. As a result, the organic light emitting device 10 can have significantly improved lifespan properties.

According to a conventional method of manufacturing an organic light emitting device, red, green and blue emissive layers are formed in separate chambers, and then moved into a chamber for forming an electron transport layer. Thus, there is a problem in that while moving the emissive layers into another chamber, moisture existing in a deposition chamber can contact the surfaces of the red, green and blue emissive layers. Accordingly, impurities such as water or the like can infiltrate into an interface between red emissive layer and the electron transport layer, an interface between the green emissive layer and the electron transport layer, and an interface between the blue emissive layer and the electron transport layer, thereby resulting in a reduction in the lifespan of the conventional organic light emitting device.

However, in the organic light emitting device 10 illustrated in FIG. 1, the red emissive layer 22R is formed and then a part of an electron transport layer, that is, the first layer 24R, is immediately formed thereon in the same chamber, the green emissive layer 22G is formed and then a part of an electron transport layer, that is, the second layer 24G, is immediately formed thereon in the same chamber, and then the blue emissive layer 22B is formed and then a part of an electron transport layer, that is, the third layer 24B, is immediately formed thereon in the same chamber. Therefore, impurities such as water or the like do not (or do not substantially) infiltrate into an interface between red emissive layer 22R and the electron transport layer (i.e., the first layer 24R), an interface between the green emissive layer 22G and the electron transport layer (i.e., the second layer 24G), and an interface between the blue emissive layer 22B and the electron transport layer (i.e., the third layer 24B), thereby resulting in an increase in the lifespan of the organic light emitting device 10 illustrated in FIG. 1.

Also, the organic light emitting device 10 illustrated in FIG. 1 includes (or necessarily includes) the second electron transport layer 25 that is formed on the first electron transport layers 24 as a common layer with respect to red, green and blue sub-pixels (R, G, and B). That is, in the chamber 41 for forming a red emissive layer, the chamber 43 for forming a green emissive layer, and the chamber 45 for forming a blue emissive layer, not all of the electron transport layers are not formed, but only a part of the electron transport layers (i.e., only the first electron transport layer 24 of FIG. 1) is formed. More particularly, referring to FIG. 2G, a ratio of the thickness $d_1$ of the first electron transport layer 24 to the thickness $d_2$ of the second electron transport layer 25 may be in the range from about 1:9 to about 4:6 (or from 1:9 to 4:6), and, in one embodiment, from about 2:8 to about 3:7 (from 2:8 to 3:7), wherein the thicknesses of the first layer 24R, the second layer 24G, and the third layer 24B are equal (or substantially identical) to one another. By separately forming the electron transport layers in this way, mass production yield can be improved. In addition, the first electron transport layer 24 protects the emissive layers 22R, 22G and 22B when the second electron transport layer 25 is formed, and thus the organic light emitting device 10 can have improved lifespan properties.

The electron injection layer 26 that easily injects electrons from a cathode is then formed on the second electron transport layer 25. The electron injection layer 26 can be formed using various suitable methods such as vacuum deposition, spin coating, casting, or the like. When vacuum deposition or spin coating is used, the deposition or coating conditions may vary according to the compound used. In general, however, the deposition or coating conditions used to form the hole injection layer 16 are to the same (or substantially the same) as those for forming the electron injection layer 26. The electron injection layer 26 is also formed as a common layer with respect to red, green and blue sub-pixels (R, G, and B), as illustrated in FIG. 1.

The electron injection layer 26 can include any suitable materials such as LiF, NaCl, CsF, $Li_2O$, BaO, or the like. The thickness of the electron injection layer 26 may be in the range from about 0.1 to about 10 nm, and, in one embodiment, in the range from 0.2 to 5 nm. When the thickness of the electron injection layer 26 is within the ranges described above, an organic light emitting device with excellent electron injecting ability and driving voltage characteristics can be manufactured.

In addition, a second electrode 28 is formed on the electron injection layer 26. The second electrode 28 can be formed using vacuum deposition, sputtering, or the like, and may be a cathode or anode. Examples of a metal used to form the second electrode include a metal having a low work function, alloys, electrical-conductive compounds, and mixtures thereof. Examples of the metal used to form the second electrode include Li, Mg, Al, Al—Li, Ca, Mg—In, Mg—Ag, and the like. In addition, various suitable modifications are possible such that a structure having at least two layers can be obtained using at least two different materials.

The organic light emitting device 10 according to an embodiment of the present invention has been described with reference to FIG. 1, but the present invention is not limited thereto and the organic light emitting device can have various suitable structures. For example, when an emissive layer of the organic light emitting device according to an embodiment of the present invention includes a phosphorescent dopant, a hole blocking layer (HBL) can be formed on the emissive layer in order to prevent (or reduce) triplet excitons or holes from being diffused into the electron transport layer. In addition, in the organic light emitting device 10 of FIG. 1, the first electron transport layer 24 can have various suitable structures so that it can include all of the first layer 24R, the second layer 24G, and the third layer 24B, or can include at least only one layer selected therefrom (as desired or necessary).

As described above, the method of manufacturing the organic light emitting device according to an embodiment of the present invention includes: forming a first electrode on a substrate; forming an organic layer including an emissive layer and an electron transport layer on the first electrode; and forming a second electrode on the organic layer. Here, in one embodiment, the emissive layer includes a red emissive layer, a green emissive layer, and a blue emissive layer. The electron transport layer includes a first electron transport layer including: at least one of a first layer that is formed on the red emissive layer and has the same (or substantially the same) pattern as that of the red emissive layer; a second layer that is formed on the green emissive layer and has the same (or substantially the same) pattern as that of the green emissive layer; and a third layer that is formed on the blue emissive layer and has the same (or substantially the same) pattern as that of the blue emissive layer, and a second electron transport layer that is formed on the first electron transport layer as a common layer with respect to red, green and blue sub-pixels.

In the method of manufacturing the organic light emitting device according to one embodiment of the present invention, the forming of the organic layer includes: (1) the forming of the emissive layer and the first electron transport layer (e.g., in one embodiment, the forming of the emissive layer and the first electron transport layer includes: forming a red emissive layer and then forming the first layer in a first deposition chamber for forming the red emissive layer, forming a green emissive layer and then forming the second layer in a second deposition chamber for forming the green emissive layer, and/or forming a blue emissive layer and then forming the third layer in a third deposition chamber for forming the blue emissive layer), and (2) forming a second electron transport layer that is formed on the first electron transport layer as a common layer with respect to red, green and blue sub-pixels.

The forming of the organic layer can further include forming at least one of a hole injection layer, a hole transport layer, a hole blocking layer or an electron injection layer.

Also, an embodiment of the present invention provides a method of forming an organic layer, including: forming a first organic layer of a first organic material in a first chamber; forming a second organic layer of a second organic material on the first organic layer in the first chamber; and a third organic layer of a second organic material on the second organic layer in a second chamber.

Figure 3A:
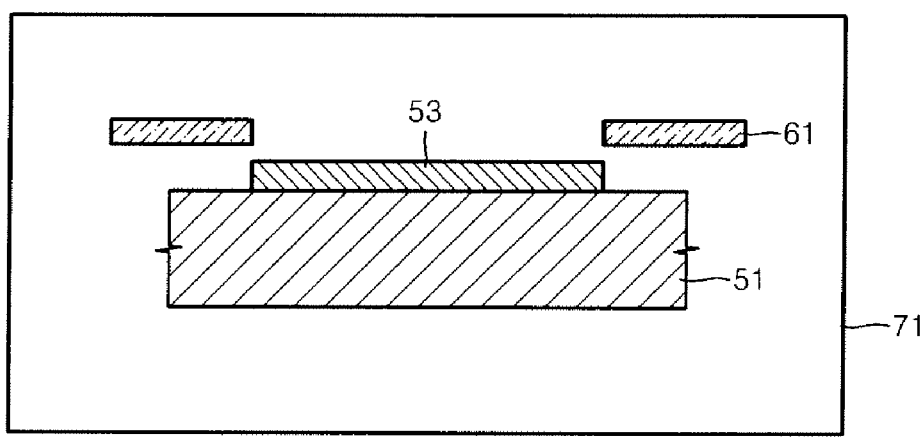
FIGS. 3A, B, and C are diagrams illustrating a method of forming an organic layer according to an embodiment of the present invention.
Figure 3B:
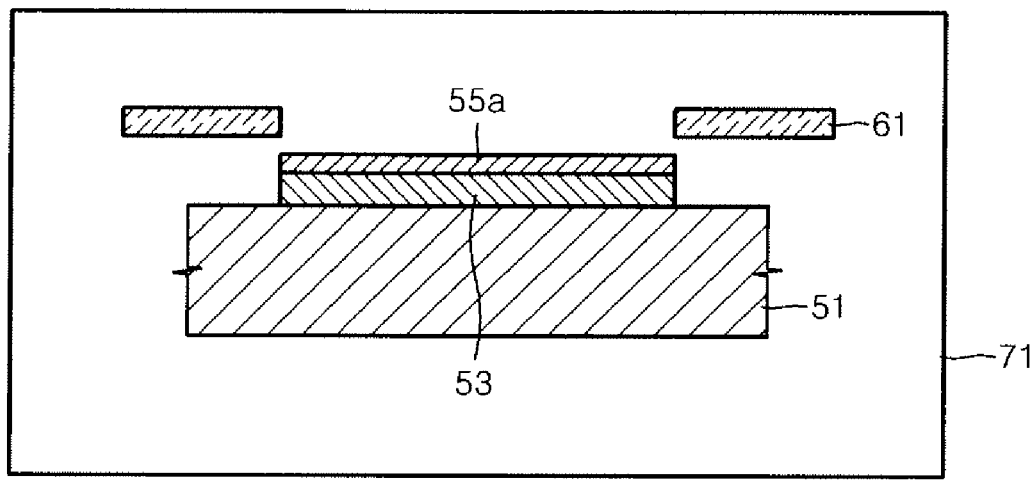
Figure 3C:
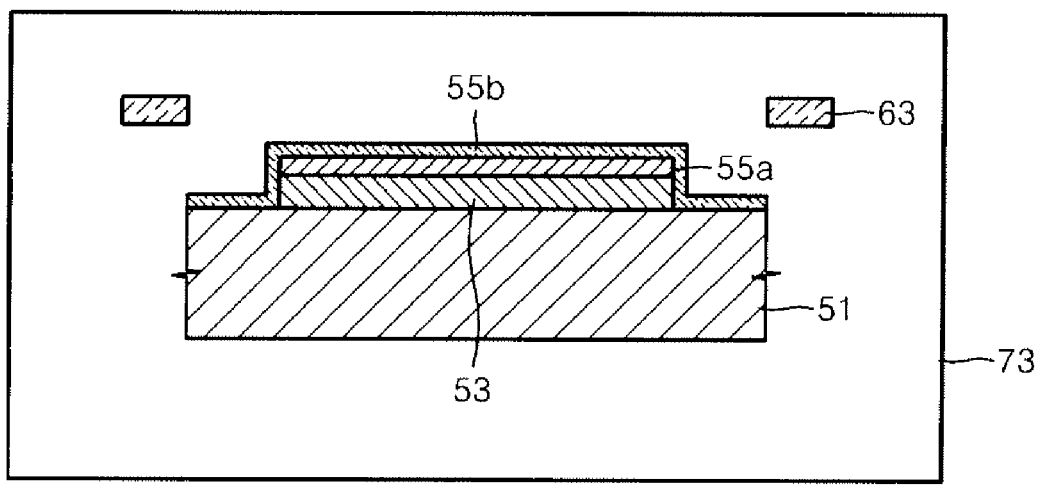

FIGS. 3A through 3C are diagrams illustrating a method of forming an organic layer according to an embodiment of the present invention.

Referring to FIG. 3A, a first organic material is deposited on a substrate 51 using a mask 61 for forming a first organic layer 53 of a first organic material in a first chamber 71.

Referring to FIG. 3B, a second organic material is then deposited on the first organic layer 53 using the mask 61 for forming a first organic layer 53 in the first chamber 71 in order to form a second organic layer 55a of a second organic material.

Referring to FIG. 3C, a second organic material is deposited on the second organic layer 55a using a mask 63 forming a third organic layer 55b of a second organic material in a second chamber 73.

In this way, impurities, such as moisture or the like, do not infiltrate (or do not substantially infiltrate) into an interface between the first organic layer 53 and the second organic layer 55a that are formed of different materials.

The forming of the organic layer as described above can be particularly advantageous in the case of the organic layer that is disposed between a pair of electrodes of the organic light emitting device. In general, the organic layer of an organic light emitting device can have a multi-layer structure including different materials. In this case, each layer including different materials can be formed in different chambers. However, there is a problem in that during the waiting time for the transfer between chambers, impurities such as moisture or the like can infiltrate into an interface between layers including different materials, thereby resulting in a reduction in the lifespan of the organic light emitting device. However, according to the forming of the organic layer as described above, when layers (that is, the first organic layer 53 and the second organic layer 55a) including different materials are formed as described with reference to FIGS. 3A and 3B, chamber transfer is not required, but when layers (that is, the second organic layer 55a and the third organic layer 55b) including the same (or substantially the same) materials are formed as described with reference to FIGS. 3B and 3C, chamber transfer is performed. Therefore, an organic light emitting device having improved lifespan can be manufactured.

More particularly, the first organic material can be a hole injecting material, the first organic layer can be a hole injection layer, the second organic material can be a hole transporting material, and the second organic layer and the third organic layer can be a hole transport layer.

In addition, the first organic material can be a hole transporting material, the first organic layer can be a hole transport layer, the second organic material can be a red emitting material, and the second organic layer and the third organic layer can be a red emissive layer.

In addition, the first organic material can be a hole transporting material, the first organic layer can be a hole transport layer, the second organic material can be a green emitting material, and the second organic layer and the third organic layer can be a green emissive layer.

In addition, the first organic material can be a hole transporting material, the first organic layer can be a hole transport layer, the second organic material can be a blue emitting material, and the second organic layer and the third organic layer can be a blue emissive layer.

In addition, the first organic material can be a red emitting material, the first organic layer can be a red emissive layer, the second organic material can be an electron transporting material, and the second organic layer and the third organic layer can be an electron transport layer.

In addition, the first organic material can be a green emitting material, the first organic layer can be a green emissive layer, the second organic material can be an electron transporting material, and the second organic layer and the third organic layer can be an electron transport layer.

In addition, the first organic material can be a blue emitting material, the first organic layer can be a blue emissive layer, the second organic material can be an electron transporting material, and the second organic layer and the third organic layer can be an electron transport layer.

In addition, the first organic material can be an electron transporting material, the first organic layer can be an electron transport layer, the second organic material can be an electron injecting material, and the second organic layer and the third organic layer can be an electron injection layer. The forming of the organic layers as described above can be used for forming each layer in the structure of organic layers of an organic light emitting device according to embodiments of the present invention.

As described above, the organic light emitting device according to an embodiment of the present invention has significantly improved lifespan properties by improving the characteristics of an interface between an emissive layer and an electron transport layer.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an organic light emitting device, the method comprising:
   forming a first electrode on a substrate;
   forming on the first electrode an organic layer comprising an emissive layer and an electron transport layer; and
   forming a second electrode on the organic layer,
   wherein the emissive layer comprises: a red emissive layer, a green emissive layer, and a blue emissive layer,
   wherein the electron transport layer comprises: a first electron transport layer comprising at least one of a first layer on the red emissive layer and having substantially the same pattern as that of the red emissive layer, a second layer on the green emissive layer and having substantially the same pattern as that of the green emissive layer, and a third layer on the blue emissive layer and having substantially the same pattern as that of the blue emissive layer; and a second electron transport layer on the first electron transport layer as a common layer with respect to red, green, and blue sub-pixels, and
   wherein the forming the organic layer comprises: a) forming the emissive layer and the first electron transport layer, the forming the emissive layer and the first electron transport layer comprising at least one of forming the red emissive layer and then forming the first layer in a same first deposition chamber for forming the red emissive layer; forming the green emissive layer and then forming the second layer in a same second deposition chamber for forming the green emissive layer; or forming the blue emissive layer and then forming the third layer in a same third deposition chamber for forming the blue emissive layer, and b) forming the second electron transport layer in a fourth deposition chamber on the first electron transport layer as a common layer with respect to the red, green, and blue sub-pixels.

2. The method of claim 1, wherein the first layer is formed utilizing a mask for forming the red emissive layer.

3. The method of claim 1, wherein the second layer is formed utilizing a mask for forming the green emissive layer.

4. The method of claim 1, wherein the third layer is formed utilizing a mask for forming the blue emissive layer.

5. The method of claim 1, wherein the first layer and the second electron transport layer are sequentially formed on the red emissive layer, the second layer and the second electron transport layer are sequentially formed on the green emissive layer, and the third layer and the second electron transport layer are sequentially formed on the blue emissive layer.

6. The method of claim 1, wherein the thicknesses of the first layer, the second layer and the third layer are substantially identical to one another.

7. The method of claim 1, wherein a thickness ratio of the first layer to the second electron transport layer, a thickness ratio of the second layer to the second electron transport layer, and a thickness ratio of the third layer to the second electron transport layer are in the range from about 1:9 to about 4:6.

8. The method of claim 1, wherein the forming of organic layers further comprises forming at least one of a hole injection layer, a hole transport layer, a hole blocking layer, or an electron injection layer.

9. A method of forming an organic layer, the method comprising:
   forming a first organic layer formed of a first organic material in a first chamber;
   forming on the first organic layer in the same first chamber a second organic layer formed of a second organic material; and
   forming on the second organic layer in a second chamber a third organic layer formed of the second organic material.

10. The method of claim 9, wherein the first, second, and third organic layers are disposed between a pair of electrodes of an organic light emitting device.

11. The method of claim 10, wherein the first organic material is a hole injecting material, the first organic layer is a hole injection layer, the second organic material is a hole transporting material, and the second organic layer and the third organic layer are a hole transport layer.

12. The method of claim 10, wherein the first organic material is a hole transporting material, the first organic layer is a hole transport layer, the second organic material is a red emitting material, and the second organic layer and the third organic layer are a red emissive layer.

13. The method of claim 10, wherein the first organic material is a hole transporting material, the first organic layer is a hole transport layer, the second organic material is a green emitting material, and the second organic layer and the third organic layer are a green emissive layer.

14. The method of claim 10, wherein the first organic material is a hole transporting material, the first organic layer is a hole transport layer, the second organic material is a blue emitting material, and the second organic layer and the third organic layer are a blue emissive layer.

15. The method of claim 10, wherein the first organic material is a red emitting material, the first organic layer is a red emissive layer, the second organic material is an electron transporting material, and the second organic layer and the third organic layer are an electron transport layer.

16. The method of claim 10, wherein the first organic material is a green emitting material, the first organic layer is a green emissive layer, the second organic material is an electron transporting material, and the second organic layer and the third organic layer are an electron transport layer.

17. The method of claim 10, wherein the first organic material is a blue emitting material, the first organic layer is a blue emissive layer, the second organic material is an electron transporting material, and the second organic layer and the third organic layer are an electron transport layer.

18. The method of claim 10, wherein the first organic material is an electron transporting material, the first organic layer is an electron transport layer, the second organic material is an electron injecting material, and the second organic layer and the third organic layer are an electron injection layer.

* * * * *